(12) United States Patent
Cui et al.

(10) Patent No.: US 10,733,412 B2
(45) Date of Patent: Aug. 4, 2020

(54) DISPLAY PANEL AND DISPLAY APPARATUS FOR FINGERPRINT IDENTIFICATION

(71) Applicant: Wuhan Tianma Micro-Electronics Co., Ltd., Wuhan (CN)

(72) Inventors: Ruili Cui, Wuhan (CN); Yangzhao Ma, Wuhan (CN); Yongzhi Wang, Wuhan (CN); Tao Peng, Wuhan (CN)

(73) Assignee: Wuhan Tianma Micro-Electronics Co., Ltd., Wuhan (CN)

( * ) Notice: Subject to any disclaimer, the term of this patent is extended or adjusted under 35 U.S.C. 154(b) by 0 days.

(21) Appl. No.: 16/230,290

(22) Filed: Dec. 21, 2018

(65) Prior Publication Data
US 2019/0325190 A1 Oct. 24, 2019

(30) Foreign Application Priority Data

Apr. 24, 2018 (CN) .......................... 2018 1 0373020

(51) Int. Cl.
*G06K 9/00* (2006.01)
*H01L 27/12* (2006.01)
(Continued)

(52) U.S. Cl.
CPC .......... *G06K 9/0004* (2013.01); *H01L 27/124* (2013.01); *H01L 27/3211* (2013.01);
(Continued)

(58) Field of Classification Search
CPC . G06K 9/0004; H01L 27/124; H01L 27/3211; H01L 27/3225; H01L 27/3276; H01L 51/5218; H01L 51/5221
See application file for complete search history.

(56) References Cited

U.S. PATENT DOCUMENTS

2015/0362776 A1* 12/2015 Jikumaru ............ G02F 1/13394
349/12
2018/0005007 A1* 1/2018 Du ...................... H01L 27/3262
(Continued)

FOREIGN PATENT DOCUMENTS

CN 107065274 A 8/2017
CN 107275376 A 10/2017
(Continued)

OTHER PUBLICATIONS

Chinese Office Action for application No. 201810373020.1; dated Apr. 1, 2020.

*Primary Examiner* — Stephen G Sherman
(74) *Attorney, Agent, or Firm* — Miller, Matthias & Hull LLP

(57) ABSTRACT

Disclosed are a display panel and a display apparatus. The display panel includes: an array substrate and a plurality of pixel units disposed on the array substrate; at least one fingerprint identification unit disposed on the array substrate and configured to perform fingerprint identification according to light reflected by a touch body; and a display region and a non-display region surrounding the display region. The display region includes a first region and a second region. The fingerprint identification units are disposed in the first region. On a side or the fingerprint identification unit facing towards a light emitting surface of the display panel, an area of a non-light transmittance region in per unit area of the first region is smaller than an area of a non-light transmittance region in per unit area of the second region.

18 Claims, 11 Drawing Sheets

(51) Int. Cl.
*H01L 27/32* (2006.01)
*H01L 51/52* (2006.01)

(52) U.S. Cl.
CPC ...... *H01L 27/3225* (2013.01); *H01L 27/3276* (2013.01); *H01L 51/5218* (2013.01); *H01L 51/5221* (2013.01)

(56) References Cited

U.S. PATENT DOCUMENTS

| | | | |
|---|---|---|---|
| 2018/0019288 A1* | 1/2018 | Yang | H01L 27/3227 |
| 2019/0237521 A1* | 8/2019 | Ju | H01L 27/323 |
| 2019/0303638 A1* | 10/2019 | Zeng | G06F 21/32 |

FOREIGN PATENT DOCUMENTS

| | | |
|---|---|---|
| CN | 107425038 A | 12/2017 |
| CN | 107870689 A | 4/2018 |

\* cited by examiner

DISPLAY PANEL AND DISPLAY APPARATUS FOR FINGERPRINT IDENTIFICATION

CROSS-REFERENCES TO RELATED APPLICATIONS

This application claims priority to a Chinese patent application No. 201810373020.1 filed on Apr. 24, 2018, the disclosure of which is incorporated herein by reference in its entirety.

TECHNICAL FIELD

Embodiments of the present disclosure relate to the display technology field, and in particular, relate to a display panel and a display apparatus.

BACKGROUND

Fingerprints are inherent to every person. With the development of science and technology, various display apparatuses having fingerprint identification functions appear on the market. Such apparatuses include mobile phones, tablet PCs, smart wearable equipment, etc. Before operating a display apparatus with the fingerprint recognition function, a user just needs to touch the display apparatus by his finger for the authority verification, thereby simplifying the authority verification process.

For a display panel with the fingerprint identification function, the fingerprint identification unit is generally disposed below an array substrate. Light emitted by a light source is reflected by a touch body, passes through the array substrate and then is received by the fingerprint identification unit below the array substrate. In this way, the fingerprint identification function of the display panel is implemented. The display panel includes a plurality of opaque metal layers occupying most of the projected area of the display panel. Therefore, the light transmittance of the display panel is low, the light reflected to the fingerprint identification unit is reduced, and the magnitude of fingerprint identification signal of the display panel is reduced.

SUMMARY

The present disclosure provides a display panel and a display apparatus. On a side, facing towards a light emitting surface of the display panel, of a fingerprint identification unit, an area of a non-light transmittance region in per unit area of the first region where the fingerprint identification unit is provided is smaller than an area of a non-light transmittance region in per unit area of the second region, which increases light transmittance per unit area of the first region where the fingerprint identification unit is provided compared with the existing art, and benefits for increasing the magnitude of the fingerprint identification signal of the display panel.

In a first aspect, an embodiment of the present disclosure provides a display panel, including: an array substrate and a plurality of pixel units disposed on the array substrate, at least one fingerprint identification unit, and a display region and a non-display region surrounding the display region.

The at least one fingerprint identification unit is disposed on a side, facing away from the pixel units, of the array substrate and used for performing fingerprint identification according to light reflected by a touch body to the fingerprint identification unit.

The display region includes a first region and a second region, and the at least one fingerprint identification unit is disposed in the first region.

On a side, facing towards a light emitting surface of the display panel, of the fingerprint identification unit, an area of a non-light transmittance region in per unit area of the first region is smaller than an area of a non-light transmittance region in per unit men of the second region, and the area is calculated with respect to a plane parallel to a plane where the display panel is located.

In a second aspect, an embodiment of the present disclosure further provides a display-apparatus including the display panel described in the first aspect.

Embodiments of the present disclosure provide a display panel and a display apparatus. The fingerprint identification unit is disposed on the side, facing away from the pixel units, of the array substrate and performs that fingerprint identification according to the light reflected by the touch body to the fingerprint identification unit. The display region of the display panel includes the first region provided with the fingerprint identification unit and the second region not provided with the fingerprint identification unit. On the side, facing towards the light emitting surface of the display panel, of the fingerprint identification unit, an area of the non-light transmittance region in per unit urea of the first region is smaller than an area of the non-light transmittance region in per unit area of the second region, and the area is calculated with respect to a plane parallel to a plane where the display panel is located.

BRIEF DESCRIPTION OF DRAWINGS

Other features, purposes and advantages of the present application will become more apparent after a detailed description of non-limiting embodiments with reference to the accompanying drawings is read.

DETAILED DESCRIPTION

Figure 1:
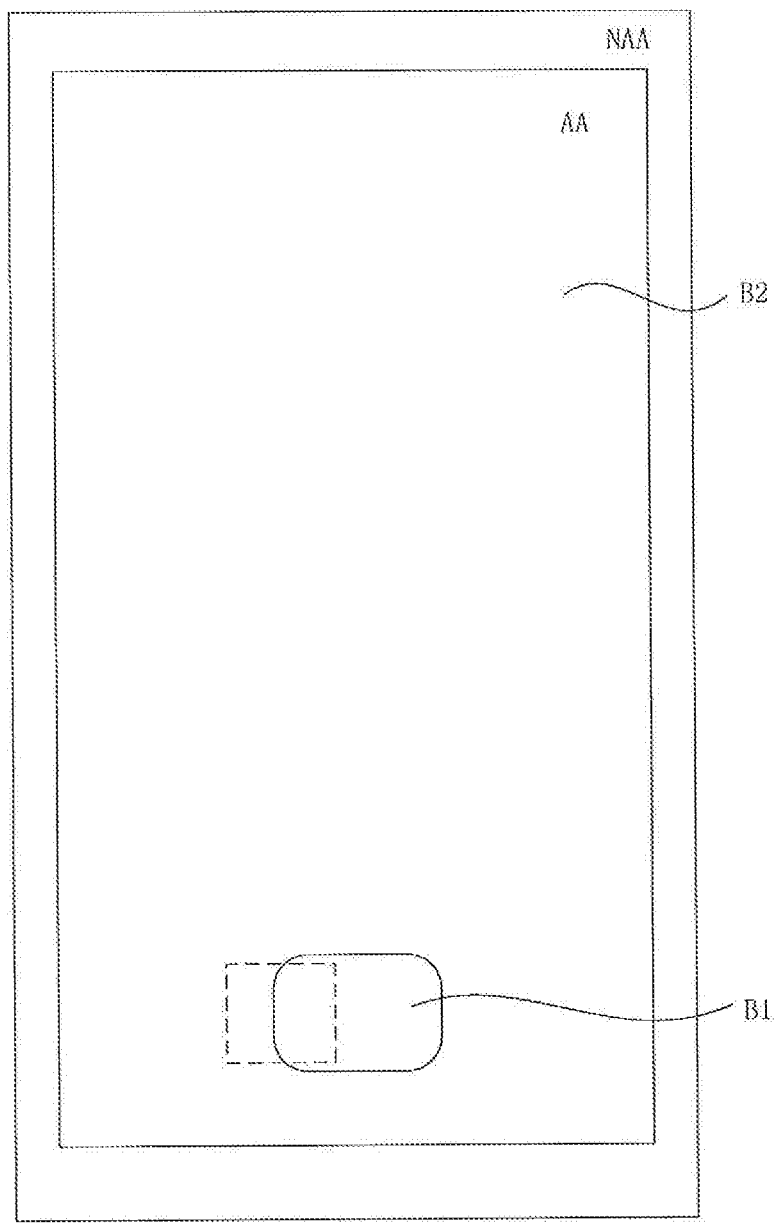
FIG. 1 is a lop structural view of a display panel according to an embodiment of the present disclosure.

The present disclosure will be further described in detail in conjunction with the accompanying drawings and embodiments. It is to be understood that the embodiments set forth below are intended to illustrate and not to limit the present disclosure. Additionally, it is to be noted that, for the convenience of description, only part, not all of structures related to the present disclosure are illustrated in the drawings. Throughout this specification, same or similar reference numerals in the drawings denote same or similar structures, components or processes. It is to be noted that if not in collision, the embodiments and features therein in the present disclosure may be combined with each other.

Embodiments of the present disclosure provide a display panel including an array substrate, a plurality of pixel units disposed on the array substrate and at least one fingerprint identification unit disposed on a side, facing away from the pixel units, of the array substrate. The display panel includes a display region and a non-display region surrounding the display region. The display region includes a first region and a second region, and the at least one fingerprint identification unit is disposed in the first region. The fingerprint identification unit is used for performing fingerprint identification according to light reflected by a touch body to the fingerprint identification unit. On a side, facing towards a light emitting surface of the display panel, of the fingerprint identification unit, an area of a non-light transmittance region in per unit area of the first region is smaller than an area of a non-light transmittance region in per unit area of the second region, and the area is calculated with respect to a plan parallel to a plane where the display panel is located.

Each person has different, unique and permanent skin patterns including fingerprints in terms of patters, breakpoints and cross points. Accordingly, fingerprints of a person may be used for representing the person and be compared with pre-stored fingerprint data to verify the identity of the person. This is the fingerprint identification technology. Thanks to electronic integrated manufacturing technologies and fast and reliable algorithm researches, the optical fingerprint identification technology among the fingerprint identification technologies has begun to appear in our daily life and has become a technology that enjoys the deepest study, widest use and best development in the biological detection. The optical fingerprint identification technology works under such principles: light emitted from a light source in a display panel is irradiated to a finger and is reflected by the finger to form reflected light, the reflected light is transmitted to a fingerprint sensor, and then optical signal incident to the fingerprint sensor is collected by the fingerprint sensor. A fingerprint has specification, so the reflected light has different intensities at different positions, such as the ridge and the valley of the finger, optical signals collected by various sensors are different, in this way, the fingerprint identification function is implemented, and accordingly the true identity of the user is determined.

For the display panel with the fingerprint identification function, the fingerprint identification unit is generally disposed below the array substrate. Light emitted by a light source is reflected by a touch body, and then the reflected light passes through the array substrate and is received by the fingerprint identification unit below the array substrate. In this way, the fingerprint identification function is implemented by the display panel. The display panel includes a plurality of opaque metal layers occupying most of the projection area of the display plane, so that the light transmittance of the display panel is low, the light reflected to the fingerprint identification unit is reduced, and the magnitude of the fingerprint identification signal of the display panel is reduced.

In the embodiments of the present disclosure, the fingerprint identification unit is disposed on the side, facing away from the pixel units, of the array substrate and performs the fingerprint identification according to the light reflected by the touch body to the fingerprint identification unit. The display region of the display panel includes the first region provided with the fingerprint identification unit and the second region provided without the fingerprint identification unit. On the side, facing towards the light emitting surface of the display panel, of the fingerprint identification unit, the non-tight transmittance region in per unit area of the first region is smaller than the non-light transmittance region in per unit area of the second region, and the area is an area calculated with respect to a plane parallel to a plane where the display panel is located, which reduces the area of the non-light transmittance region in the first region provided with the fingerprint identification unit relative to the related art, increases light transmittance of the first region, and benefits for increasing the magnitude of the fingerprint identification signal of the display panel.

The above is the core concept of the present disclosure. Technical solutions in the embodiments of the present disclosure will be described clearly and completely in conjunction with drawings in the embodiments of the present disclosure. Based on the embodiments of the present disclosure, all other embodiments obtained by those skilled in the art without making creative work are within the scope of the present disclosure.

Figure 2:
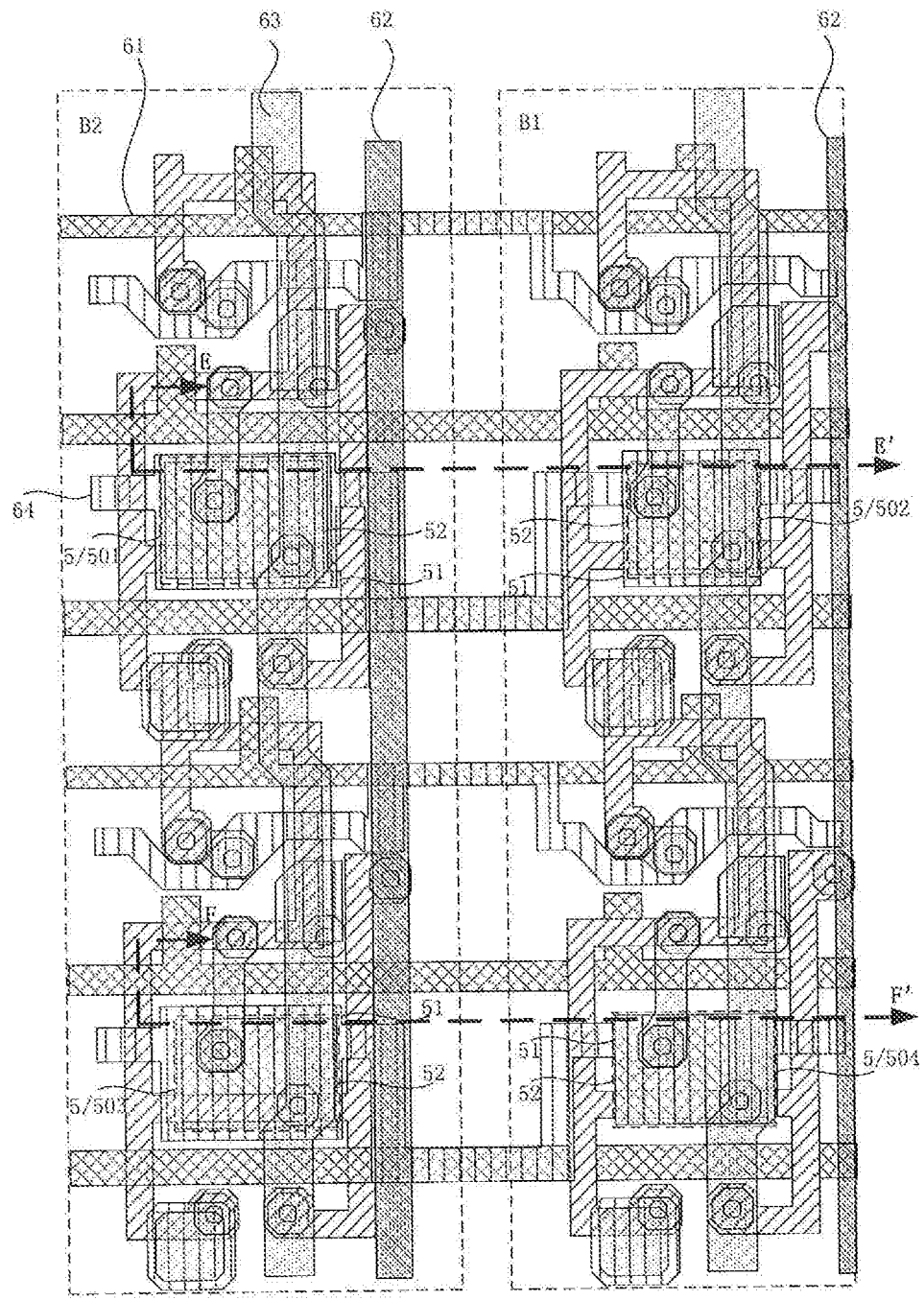
FIG. 2 is a partial enlarged view of a dashed hue region of FIG. 1.
Figure 3:
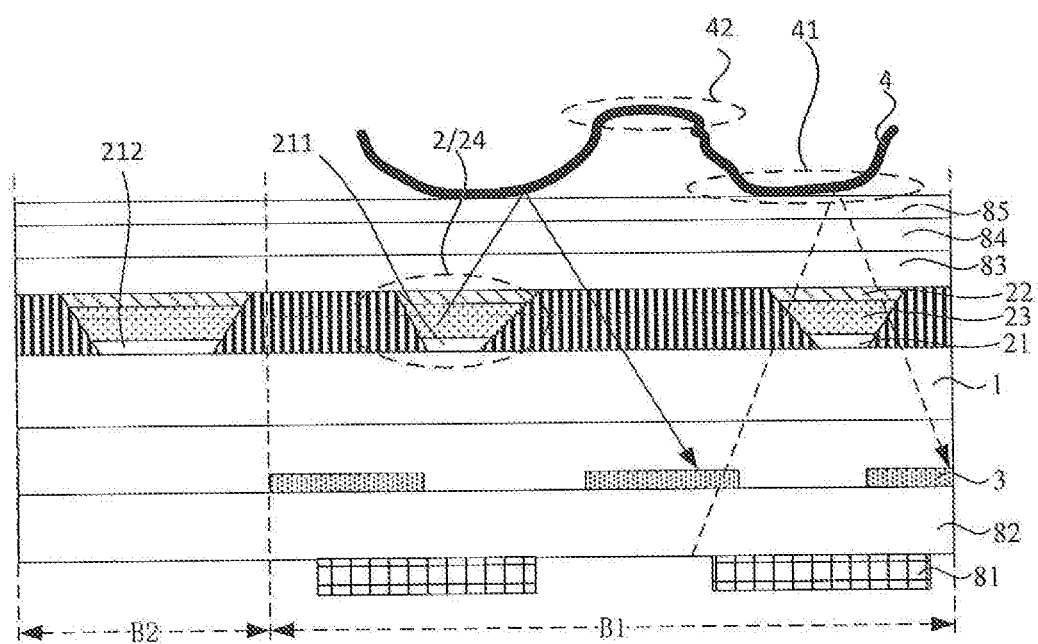
FIG. 3 is a cross-sectional view of a display panel according to an embodiment of the present disclosure.

FIG. 1 is a top structural view of a display panel according to an embodiment of the present disclosure, FIG. 2 is a partial enlarged view of a dashed line region of FIG. 1, and FIG. 3 is a cross-sectional view of a display panel according to an embodiment of the present disclosure. In conjunction with FIGS. 1-3, the display panel includes an array substrate 1, a plurality of pixel units 2 on the array substrate 1, and at least one fingerprint identification unit 3. The fingerprint identification unit 3 is disposed on a side, facing away from the pixel units 2, of the array substrate 1 and used for performing fingerprint identification according to light reflected by a touch body 4 to the fingerprint identification unit 3. The display panel includes a display region AA and a non-display region NAA surrounding the display region AA. The display region AA includes a first region B1 and a second region B2, and at least one fingerprint identification unit 3 is disposed in the first region B1, that is, the first region B1 is provided with the fingerprint identification unit 3 and the second region B2 is not provided with the fingerprint identification unit 3. On a side, facing towards a light emitting surface of the display panel, of the fingerprint identification unit 3, that is, on a side, facing away from the fingerprint identification unit 3, of the pixel unit 2, an area of a non-light transmittance region in per unit area of the first region B1 is smaller than an area of a non-light transmittance region in per unit area of the second region, and the area is an area calculated with respect to a plane parallel to a plane where the display panel is located.

Specifically, in conjunction with FIGS. 1-3, the display panel includes a plurality of opaque structures, and the structures shown in FIG. 2 are all opaque. Along a direction parallel to the plane of the display panel, the regions where the opaque structures are disposed constitute the non-light transmit lance region, and the regions between the opaque structures constitute the light transmittance region. It is to be understood that in the embodiment, the opaque structures may include opaque metal layers, and therefore, the area of the opaque region is an urea of the regions covered by the orthographic projections of the metal layers of the display panel on the plane where the display panel is located. The fingerprint identification unit 3 is disposed on the side, facing away from the pixel unit 2, of the array substrate 1, so the light reflected by the touch body 4 to the fingerprint identification unit 3 is received by the fingerprint identification unit 3 only through the light transmittance region. The fingerprint identification unit 3 performs fingerprint identification according to the received light and thus the area of the non-light transmittance region is inversely proportional to the optical signal received by the fingerprint identification unit 3. On the side, facing away from the light emitting surface of the display panel, of the fingerprint identification unit 3, the non-light transmittance region in per unit area of the first region B1 is smaller than the non-light transmittance region in per unit area of the second region B2, and the area is calculated with respect to a plane parallel to a plane where the display panel is located, which reduces an area of the non-light transmittance region in the first region B1 provided with the fingerprint identification unit 3 relative to the related art, and benefits for increasing the magnitude of the fingerprint identification signal of the display panel.

As shown in FIG. 3, the touch body 4 is generally a finger, and the fingerprint includes a series of ridges 41 and valleys 42 on a skin surface of the end of the finger. Since the distance between the ridge 41 and the fingerprint identification unit 3 is different from the distance between the valley 42 and the fingerprint identification unit 3, the light reflected by the ridges 41 and received by the fingerprint identification unit 3 and the light reflected by the valleys 42 and received by the fingerprint identification unit 3 are different in intensity, so that the magnitudes of me current signals converted from the reflected light formed at the ridges 41 and the magnitudes of the current signals converted from the reflected light formed at the valleys 42 are different, and thus the fingerprint identification may be performed according to the magnitudes of the current signals. It is to be noted that the touch body 4 may also be a palm or the like, and the detecting and identifying functions may also be implemented by using the palm print.

Figure 4:
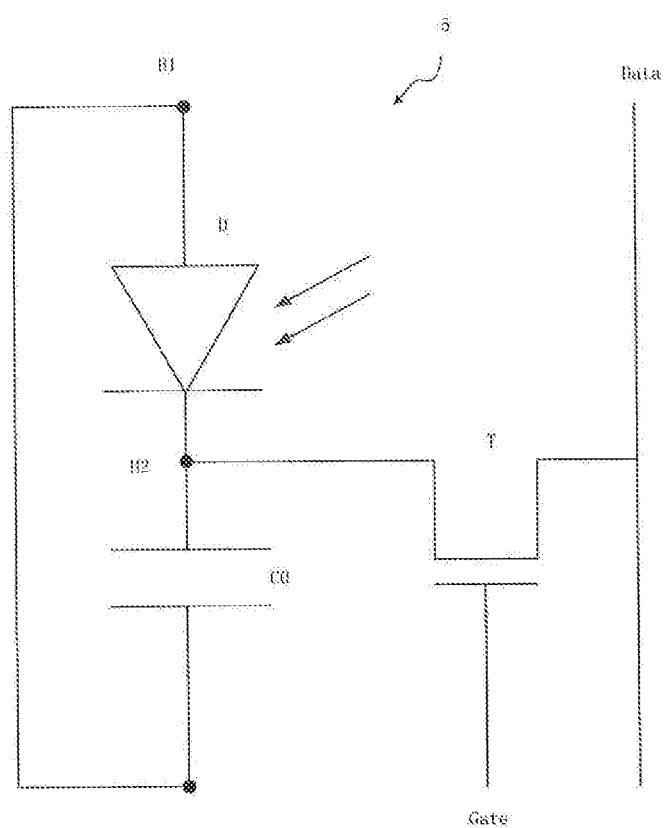
FIG. 4 is an equivalent circuit diagram of a fingerprint identification unit according to an embodiment of the present disclosure.
Figure 5:
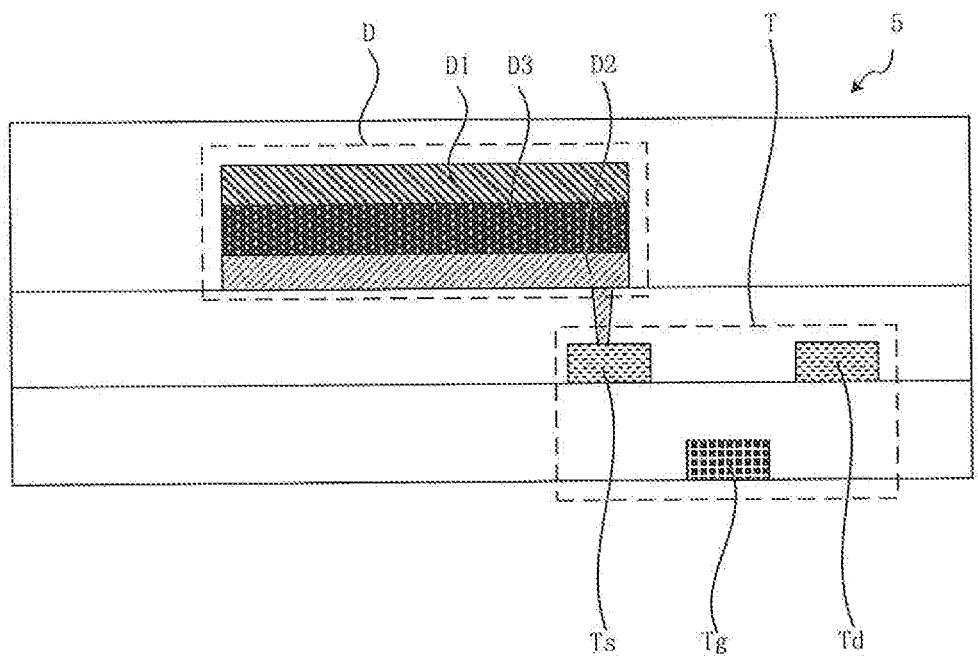
FIG. 5 is a diagram illustrating films of a fingerprint identification unit according to an embodiment of the present disclosure.

FIG. 4 is an equivalent circuit view of a fingerprint identification unit according to an embodiment of the present disclosure, and FIG. 5 is a view of films of a fingerprint identification unit according to an embodiment of the present disclosure. In conjunction with FIGS. 4 and 5, the fingerprint identification unit 3 includes a photosensitive diode D, a storage capacitor C0 and a thin film transistor T. An anode D1 of the photosensitive D is electrically connected to a first electrode of the storage capacitor C0, and a cathode D2 is electrically connected to a second electrode of the storage capacitor C0 and a source electrode Ts of the thin film transistor T. A gate electrode Tg of the thin film transistor T is electrically connected to a switch control line Gate, and a drain electrode Td of the thin film transistor T is electrically connected to a signal line Data. The photosensitive diode D is used for converting light reflected by the touch body 4 into a current. Specifically, the photosensitive diode D further includes a PIN junction D3 between the anode D1 and the cathode D2. The cathode D2 is made of opaque metal, and a border of the PIN junction D3 docs not exceed a border of the cathode D2. The anode D1 of the photosensitive diode D is disposed on a side, facing away from the thin film transistor T, of the PIN junction D3. The PIN junction D3 is photosensitive and unidirectionally conductive. When being not irradiated by any light, the PIN junction D3 has a small reverse saturation leakage current. i.e., a dark current. In this case, the photosensitive diode D is turned off. When the PIN junction D3 is irradiated by light, the reverse saturation leakage current of the PIN junction D3 dramatically increases to form a light current. The light current varies with an intensity of incident light.

The principle of the fingerprint identification on the display panel will be described in detail in conjunction with FIGS. 4 and 5. In a fingerprint identification stage, a low voltage signal (such as a constant voltage signal of a magnitude of −5 V) is inputted to a node H1, and a high voltage signal (such as a constant voltage signal of a magnitude of 1.5V) is inputted to the signal line Data. The fingerprint identification stage includes a preparation stage, a fingerprint signal acquisition stage and a fingerprint signal detection stage. In the preparation stage, a driving chip electrically connected to the fingerprint identification unit 3 turns on the thin film transistor T of the fingerprint identification unit 3 via the switch control line Gate. Then the storage capacitor C0 is charged until the charging is completed. In the fingerprint identification stage, the thin film transistor T of the fingerprint identification unit 3 is turned off by the driving chip via the switch control line Gate. When the user presses the display panel with his/her finger, the light is reflected by the finger, and the reflected light is incident on the fingerprint identification unit 3 and is received by the photosensitive diode D of the fingerprint identification unit 3 to form the light current. The direction of the light current is from a node 112 to the node H1, and then the potential of the H2 changes. In the fingerprint signal detection stage, the potential variation of the node H2 may be directly detected, such that the magnitude of the light current is determined to implement the fingerprint identification function of the display panel. Exemplarily, in the fingerprint signal detection stage, the thin film transistor T of the fingerprint identification unit 3 is turned on via the switch control line Gate, a potential difference exists between the two electrodes of the storage capacitor C0 and the storage capacitor C0 is charged, and the quantity of increased charges of the storage capacitor C0 is detected, and the magnitude of the light current is determined based on the quantity of increased charges of the storage capacitor C0. In this way, the fingerprint identification function of the display panel may also be implemented.

Figure 6:
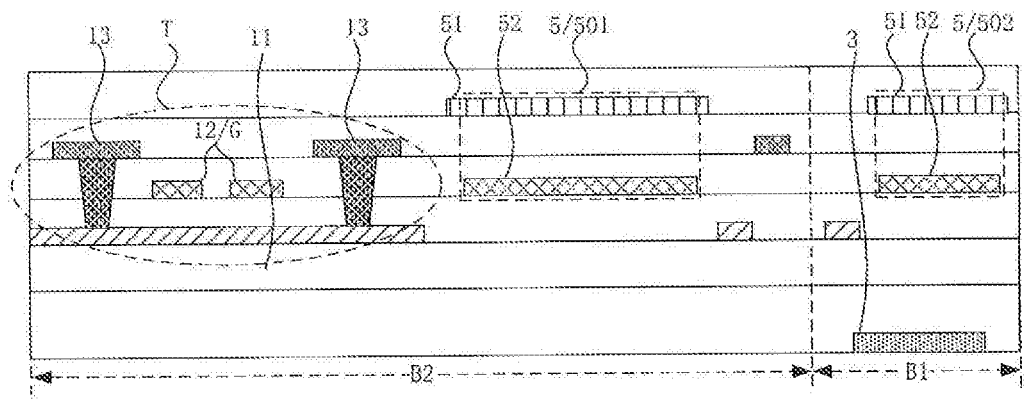
FIG. 6 is a cross-sectional view taken along the line EE' in FIG. 2.

FIG. 6 is a cross-sectional view taken along the line EE' in FIG. 2. In conjunction with FIGS. 1-3 and FIG. 6, the array substrate 1 may include a plurality of electrode pairs each including a first electrode 51 and a second electrode 52, which are opposite to each other and form a capacitor 5. An area of an orthographic projection of the capacitor 5 in the first region B1 on the plane where the display panel is disposed may be smaller than an area of an orthographic projection of the capacitor 5 in the second region B2 on the plane where the display panel is disputed.

Optionally, at least one first electrode 51 in the first region B1 may have a smaller area than the first electrode 51 in the second region B2, and at least one second electrode 52 in the first region 111 may have a smaller area than the second electrode 52 in the second region B2. Exemplarily, as shown in FIGS. 2 and 6, the capacitors 5 may include capacitors 501 and capacitors 502. The capacitor 502 is disposed in the first region B1, and the capacitor 502 is disposed in the second region B2. The first electrode 51 of the capacitor 502 in the first region B1 may have a smaller urea than the first electrode 51 of the capacitor 501 in the second region B2, and the second electrode 52 of the capacitor 502 in the first region B1 may have a smaller area than the second electrode 52 of the capacitor 501 in the second region B2. That is, relative to the related art, both the area of the first electrode 51 and the area of the second electrode 52 of the capacitor 5 in the first region B1 are reduced. Since the fingerprint identification unit 1 is provided in the first region B1 the light reflected by the touch body will be blocked by the opaque structures (the first electrode 51 and the second electrode 52) of the capacitor 5 and cannot be received by the fingerprint identification unit 3. An area of an orthographic projection of the capacitor 5 in the first region B1 on the plane where the display panel is located is smaller than an area of an orthographic projection of the capacitor 5 in the second region B2 on the plane where the display panel is located, such that the area of the non-light transmit lance region of the first region B1 is reduced, which benefits for increasing the amount of fingerprint identification signals of the display panel.

Figure 7:
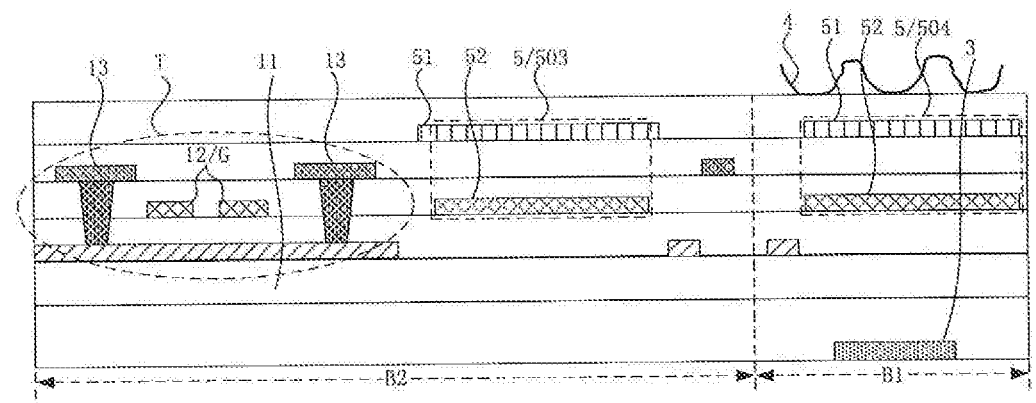
FIG. 7 is a cross-sectional view taken along the line FF' in FIG. 2.
Figure 8:
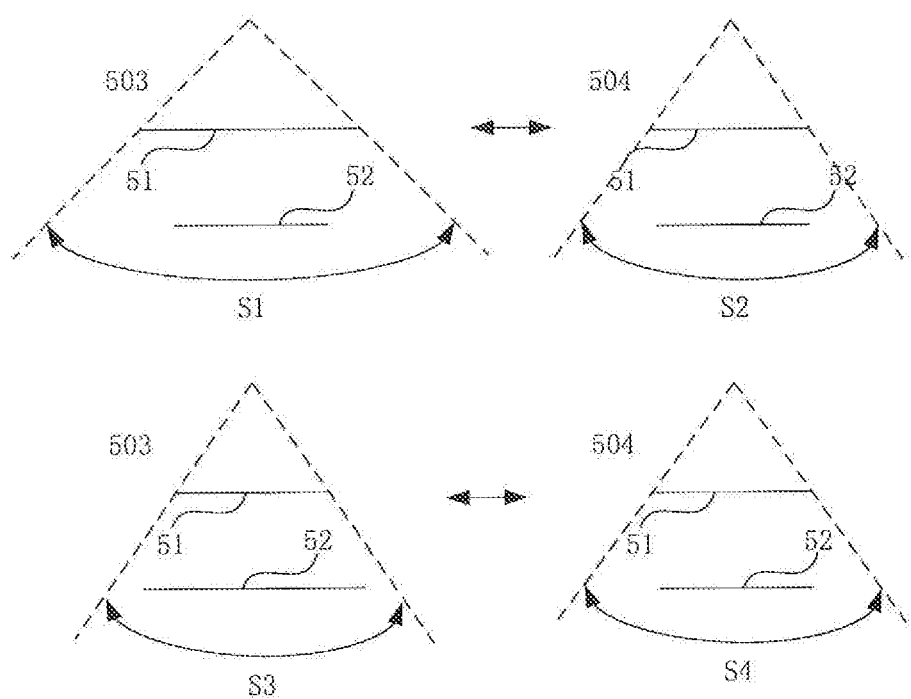
FIG. 8 is are diagrams illustrating how a capacitor in a first region blocks light and how a capacitor in a second region blocks light.

FIG. 7 is a cross-sectional view taken along the line FF' in FIG. 2. In conjunction with FIGS. 1-3 and FIG. 7, the array substrate may include the plurality of electrode pairs each including a first electrode 51 and a second electrode 52, which are opposite to each other and form a capacitor 5. The first electrode 51 is disposed on the side, facing away from the fingerprint identification unit 3, of the second electrode 53. At least one first electrode 51 in the first region B1 may have a smaller area than the first electrode 51 in the second region B2. Exemplarily, as shown in FIGS. 2 and 7, the capacitors 5 include a capacitor 503 and a capacitor 504. The capacitor 504 is disposed in the first region B1, and the capacitor 503 is disposed in the second region B2. The first electrode 51 of the capacitor 504 in the first region B1 may have a smaller urea than the first electrode 51 of the capacitor 503 in the second region B2. FIG. 8 exemplarily shows how the capacitor 504 in the first region B1 blocks light and how the capacitor 503 in the second region B2 blocks light. As shown in the upper two figures in FIG. 8, the area of the first electrode is reduced in the embodiment of the present disclosure relative to the related art. As shown in the lower two figures in FIG. 8, the area of the second electrode is reduced in the embodiment of the present disclosure relative to the related art. As shown in FIG. 7 and FIG. 8, since the first electrode 51 is disposed on the side, facing away from the fingerprint identification unit 3, of the second electrode 52, the first electrode 51 is closer to the touch body, and the light reflected by the touch body 4 first reaches the first electrode 51. That is, the first electrode 51 is closer to the starting point of the propagation path of the light reflected by the touch body 4. For the electrode of the same area, the closer the electrode is to the starting point of the propagation path of the light reflected by the touch body 4, the more light is blocked, and therefore, decreasing the area of the first electrode 51 is more effective than decreasing the area of the second electrode 52 in increasing the amount of fingerprint identification signals of the display panel. That is, S2 is significantly smaller than S1, and S3 and S4 are almost the same, where S denotes the size of the apex angle of the sector that the light cannot reach.

Optionally, referring to FIGS. 3, 6, and 7, the array substrate 1 may include a first substrate, and a gate layer 12 and a source-drain layer 13 sequentially disposed in a direction away from the first substrate 11. Each pixel unit 2 includes an anode 21, a light emitting layer 23 and a cathode 22 which are sequentially arranged in a direction away from the array substrate 1. The second electrodes 52 are disposed in the gate layer 12, that is, the second electrodes 52 may be made of the same materials and formed in the same procedure as the gate electrode G of the thin film transistor T to simplify the fabrication process of the display panel.

Figure 9:
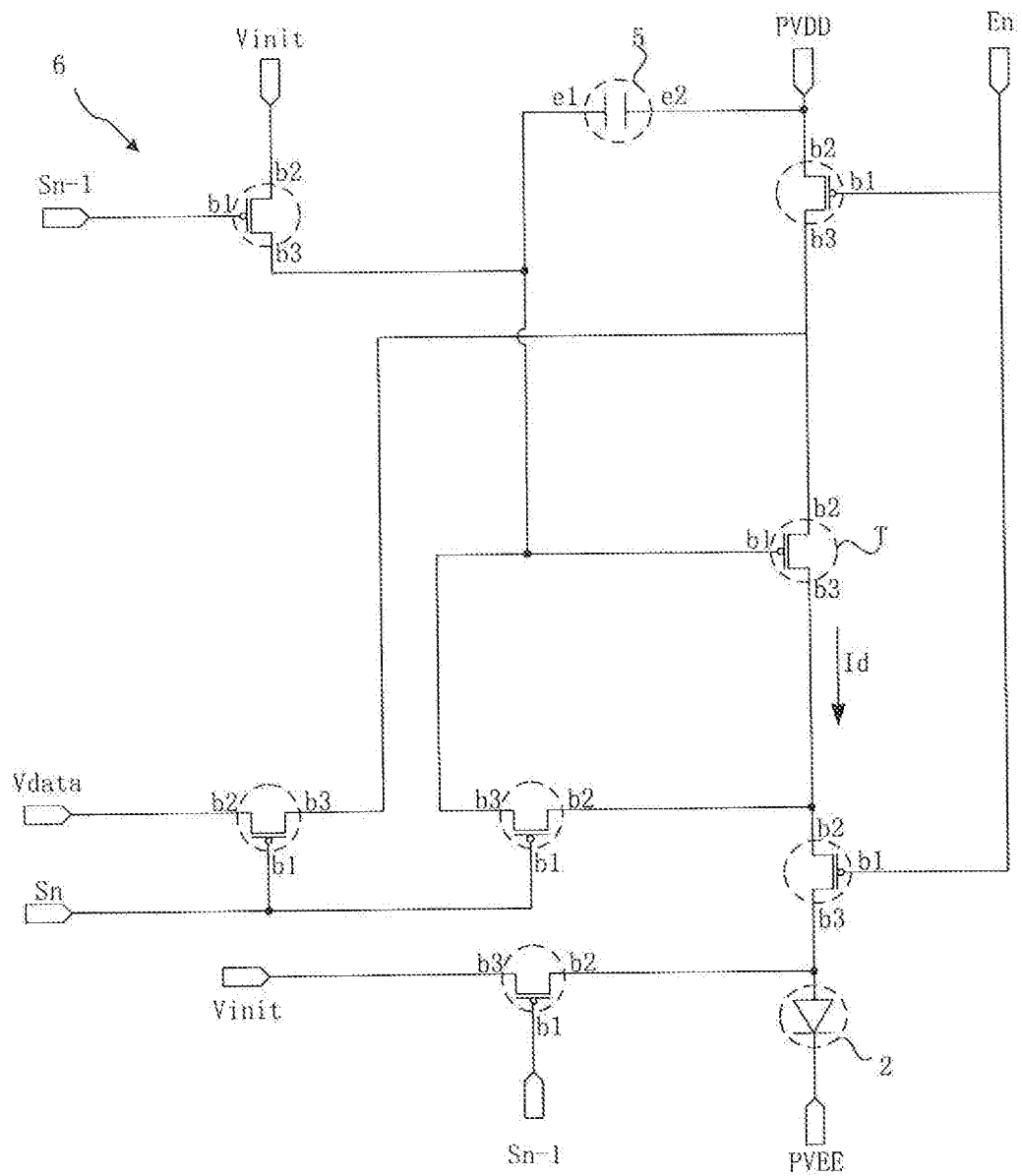
FIG. 9 is a schematic diagram of a pixel driving circuit of a pixel unit according to an embodiment of the present disclosure.

Optionally, in the first region B1, at least one first electrode 51 each of which has an area equal to the area of the first electrode 51 in the second region B2 may be disposed between any two first electrodes 51 each of which has an area smaller than the urea of the first electrode 51 in the second region B2. FIG. 9 is a schematic diagram of a pixel driving circuit of the pixel unit according to an embodiment of the present disclosure. In conjunction with FIGS. 2 and 9, a pixel driving circuit 6 includes a plurality of thin film transistors, among which the thin film transistor T is a driving transistor. A terminal e1 of the capacitor 5 provides a turn-on voltage to a gate electrode b1 of the driving transistor T. If the first electrode 51 in the first region B1 has a smaller area than the first electrode 51 in the second region B2, a capacitance value of the capacitor 5 corresponding to the first electrode 51 in the first region B1 is smaller than a capacitance value of the capacitor 5 corresponding to the first electrode 51 in the second region B2. That is, the capacitance value of the capacitor 5 corresponding to the first electrode 51 in the first region B1 is smaller the capacitance value of the capacitor 5 corresponding to the first electrode 51 in the second region B2. The terminal e1 of the capacitor 5 provides the turn-on voltage to the gate electrode b1 of the driving transistor T, and the capacitor 5 having a small capacitance value causes the voltage of the gate electrode b1 of the driving transistor T to rise faster. If the driving transistor T is a P-type transistor, the luminance of the pixel unit 2 driven by the driving transistor f is small. If the driving transistor T is an N-type transistor, the luminance of the pixel unit 2 driven by the driving transistor T is large. That is, relative to the related art, in the embodiment, the capacitance value of the capacitor 5 corresponding to the first electrode 51 with a reduced area in the first region B1 is different from the capacitance value of the capacitor 5 corresponding to the first electrode 51 in the first region B1 with the same area as the first electrode 51 in the second region B2, making that the luminance of the pixel unit 2 corresponding to the first electrode 51 with the reduced urea in the first region B1 is different from the luminance of the pixel unit 2 corresponding to the first electrode 51 in the first region B1 with the same area as the first electrode 51 in the second region B2. Therefore at least one first electrode 51 each having an area equal to the area of the first electrode 51 in the second region B2 is disposed between any two first electrode 51 each having an area smaller than the area of the first electrode 51 in the second region B2, which can effectively prevent the first electrodes 51 in the first region B1, each of which has a smaller area than the first electrode 51 in the second region B2 from being adjacent to each other. In addition to ensuring the improvement of the light transmittance of the first region B1 and the detection accuracy of the fingerprint identification unit, such configuration also prevents the pixel units 2 with abnormal luminance in the first region B1 of the display panel from being consecutively arranged, thereby avoiding a large abnormal luminance area visible to the human eye and reducing its influence on the display effect of the first region B1 of the display panel. In addition to ensuring the improvement of the light transmittance of the first region B1 and the detection accuracy of the fingerprint identification unit, such configuration not only makes that the capacitors in the first region B1 further include capacitors each of which has a capacitance value equal to the capacitance value of the capacitor in the second region, hut also makes that the capacitors in the first region B1 each of which has an area smaller than an area of the capacitor in the second region and the capacitors in the first region B1 each of which has an area equal to an area of the capacitor in the second region are alternately arranged, which is beneficial for reducing the difference between the film configuration in the first region B1 and the film configuration in the second region B2 to ensure a uniform distribution of the electrode structures of the capacitors in the first region B1 and the second region B2.

It is to be noted that, in the embodiment of the present disclosure, the capacitors in the first region B1 include two types: the capacitor having a smaller area than the first electrode 51 in the second region B2 and the capacitor having the same area as the first electrode 51 in the second region B2. In other optional embodiments of the present disclosure, the second electrode 52 in the first region B1 may have the same area as the second electrode 52 in the second region B2, such that the capacitor in the first region B1 has an improved ability of storing an electrical signal while ensuring the improvement of the light transmittance of the first region B1 and improving the detection accuracy of the fingerprint identification unit. Accordingly, it is prevented that the storage ability of the capacitor in the first region B1 of the display panel is greatly different from that of the capacitor in the second region B2, which affects the display effect of the display panel. In other optional embodiment of the present disclosure, the second electrode 52 in the first region B1 may have a smaller area that the second electrode 52 in the second region B2. Optionally, capacitors in the first area B1 may include a capacitor an area of an orthographic projection of which on the plane of the display panel is the same as an area of an orthographic projection of the capacitor in the second region U2 on the plane of the display panel, and a capacitor an area of an orthographic projection of which on the plane of the display panel is smaller than the area of the orthographic projection of the capacitor in the second region B2 on the plane of the display panel.

Figure 10:
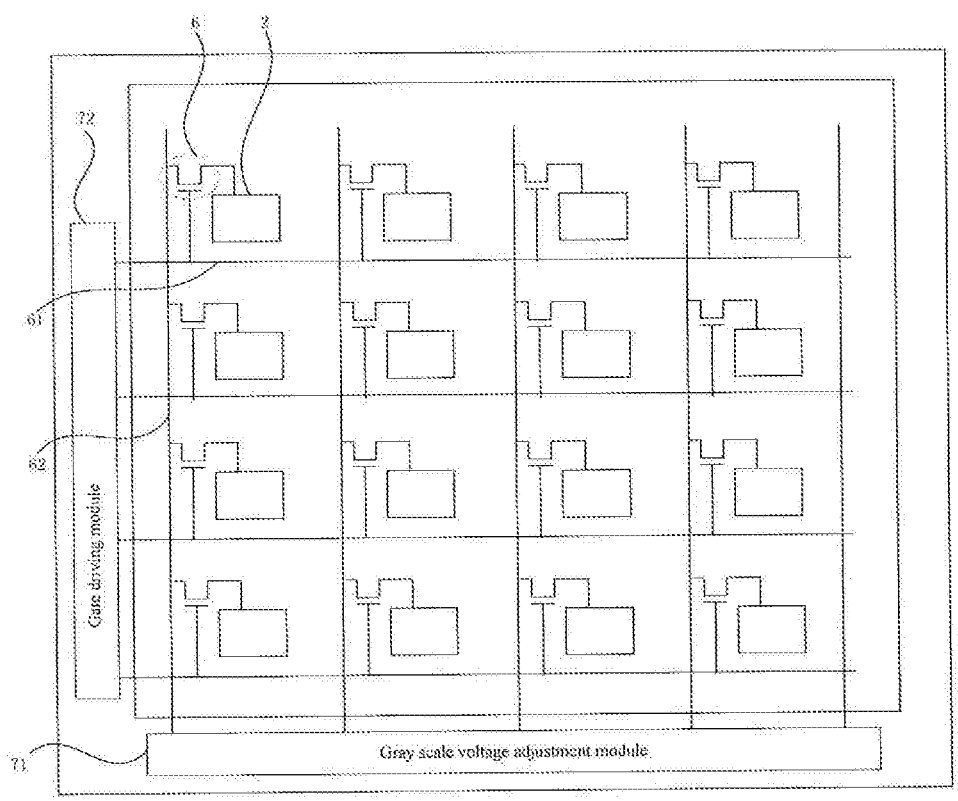
FIG. 10 is a top structural view of another display panel according to an embodiment of the present disclosure.

FIG. 10 is a top structural view of another display panel according to an embodiment of the present disclosure. In conjunction with FIGS. 1, 2, 3, 9 and 10, the display panel may further include a gray scale voltage adjustment module 71 configured to adjust the magnitude of the gray scale voltage outputted to the pixel unit 2, and a plurality of pixel driving circuits 6. When the driving transistor T in the pixel driving circuit 6 is the P-type transistor and a luminance of the first pixel unit is equal to that of the second unit, the gray scale voltage outputted by the gray scale voltage adjustment module 71 to a first pixel unit is greater than the gray scale voltage outputted by the gray scale voltage adjustment module 71 to a second pixel unit. Optionally, the thin film transistors in the pixel driving circuit 6 may all be P-type transistors. When the driving transistor T in the pixel driving circuit 6 is the N-type transistor, the gray scale voltage output by the gray scale voltage adjustment module 71 to the first pixel unit is smaller than the gray scale voltage outputted by the gray scale voltage adjustment module 71 to the second pixel unit. Optionally, the thin film transistors in the pixel driving circuit 6 may all be the N-type transistors. The first pixel unit is a pixel unit 2 corresponding to the first electrode 51 in the first region B1 having a smaller area than the first electrode 51 in the second region B2, and the second pixel unit is a pixel unit 2 corresponding to the first electrode 51 in the second region B2.

It is to be noted that in the exemplary embodiment shown in FIG. 9, the pixel driving circuit includes seven thin film transistors and one capacitor, that is a 7T1C structure. However, the present disclosure is not limited to the 7T1C structure. For other types of pixel driving circuits, the driving transistor is a thin film transistor whose drain current determines the luminance of the pixel unit in the pixel unit illumination stage.

Specifically, in conjunction with FIGS. 9 and 10, the display panel may be for example, an organic light emitting display panel. The display panel includes a plurality of pixel driving circuits 6, a plurality of scanning signal lines 61 extending along the first direction, a plurality of data signal lines 62 extending along the second direction, and a plurality of pixel units 2. The first direction intersects the second direction. The pixel driving circuit 6 and the pixel unit 2 may be disposed in a region defined by the intersection of the scanning signal line 61 and the data signal line 62. A gate driving module 72 outputs a scanning signal to the corresponding scanning signal line 61, and the pixel driving circuit 6 may connect the data signal line 62 and pixel unit 2 correspondingly electrically connected thereto under the action of the scanning signal inputted by the scanning signal line 61 electrically connected to the pixel driving circuit 6. The gray scale adjustment module 71 outputs the gray scale voltage to the corresponding pixel unit 2 through the data signal line 62, to implement the display function of the display panel. Referring to the above description, when the driving transistors T in the pixel driving circuit 6 are all P-type transistors, the luminance of the first pixel unit is lower than that of the second pixel unit. The gray scale voltage outputted by the gray scale voltage adjustment module 71 to the first pixel unit is set to the greater than the gray scale voltage outputted by the gray scale voltage adjustment module 71 to the second pixel unit, which can not only reduce the difference between the luminance of the first pixel unit and the luminance of the second pixel unit, thereby alleviating the problem of display unevenness due to the reduced area of the first electrode 51 in the first region B1 of the display panel relative to the related art, but also reduce the area of the non-light transmittance region of the first region B1 by decreasing the area of the find electrode 51 in the first region B1 relative to the related art, thereby increasing the magnitude of the fingerprint identification signal of the display panel. Similarly, when the driving transistors T in the pixel driving circuit 6 are all N-type transistor, the luminance of the first pixel unit is greater than that of the second pixel unit. The gray scale voltage outputted by the gray scale voltage adjustment module to the first pixel unit is set to be smaller than the gray scale voltage outputted by the gray scale voltage adjustment module to the second pixel unit, which can not only reduce the difference between the luminance of the first pixel unit and the luminance of the second pixel unit, thereby alleviating the problem of display unevenness due to the reduced area of the first electrode 51 in the first region B1 of the display panel relative Id the related art, but also reduce the area of the non-light transmittance region of the first region B1 by decreasing the area of the first electrode 51 in the first region B1 relative to the related art, thereby increasing the magnitude of the fingerprint identification signal of the display panel.

Optionally, in conjunction with FIGS. 1-3, the pixel units 2 of the display panel may include pixel units configured to emit lights of at least two different colors, for example, a first type pixel unit configured to emit a first color light and a second type unit configured to emit a second color light different from the first color light. The pixel units 2 of the display panel may include a red pixel unit, a green pixel unit, and u blue pixel unit. In the first region B1, multiple first electrodes 51 each having a smaller area than the first electrode 51 in the second region B2 may be disposed in the pixel units 2 of the same color. For example, in the first region B1, the multiple first electrodes 51 each having a smaller area than the first electrode 51 in the second region B2 may be respectively disposed in the red pixel units 2, or respectively disposed in the green pixel unit 2, or respectively disposed in the blue pixel unit 2. The luminance of the pixel unit 2 corresponding to the first electrode 51 having a smaller urea than the first electrode 51 in the second region B2 is different from the luminance of the pixel unit 2 corresponding to the first electrode 51 in the second region B2, so the pixel units 2, in the first region B1, different in luminance from the pixel unit 2 in the second region B2 are configured to be of the same color, and thus the color washouts of the pixel units 2 in the first region B1 are uniform to avoid different color washouts of the pixel units 2 at different positions of the first region B1, for example, a white image displayed on the display panel has a color blurring problem.

Similarly, in the first region B1, multiple first electrodes 51 each having a smaller area than the first electrode 51 in the second region B2 may also be respectively disposed in the pixel units 2 of two different colors, and the quantity of first electrodes 51 in the first region B1, the area of each of which is smaller than the area of the first electrode 51 in the second region B2, disposed in pixel units 2 which emit lights of one color is equal to the quantity of first electrodes 51 in the first region B1, the area of each of which is smaller than the area of the first electrode 51 in the second region B2, disposed in pixel units 2 which emit lights of another color. For example, the quantity of first electrodes 51 in the first region B1 and each having a smaller area than the first electrode 51 in the second region B2 may be 2n, n first electrodes 51 each having a smaller area than the lint electrode 51 in the second region B2 are disposed in the red pixel unit, and the other n first electrodes 51 each having a smaller area than the first electrode 51 in the second region B2 are disposed in the green pixel unit. Alternatively, n first electrodes 51 each having a smaller area than the first electrode 51 in the second region B2 are disposed in the green pixel unit, and the other n first electrodes 51 each having a smaller area than the first electrode 51 in the second region B2 are disposed in the blue pixel unit. Alternatively, n first electrodes 51 each having a smaller area than the first electrode 51 in the second region B2 are disposed in the blue pixel unit, and the other n first electrodes 51 each having a smaller area than the first electrode 51 in the second region B2 are disposed in the red pixel unit. In this way, the pixel units 2 in the first region B1 each of which has a luminance different from the luminance of the pixel unit 2 in the second region B2 are evenly divided into the pixel units of two colors. In addition, the color washouts of the pixel units 2 in the first region B1 are uniform to avoid different color washouts of the pixel units 2 in different positions of the first region B1, for example, a white image displayed on the display panel has a color blurring problem.

Figure 11:
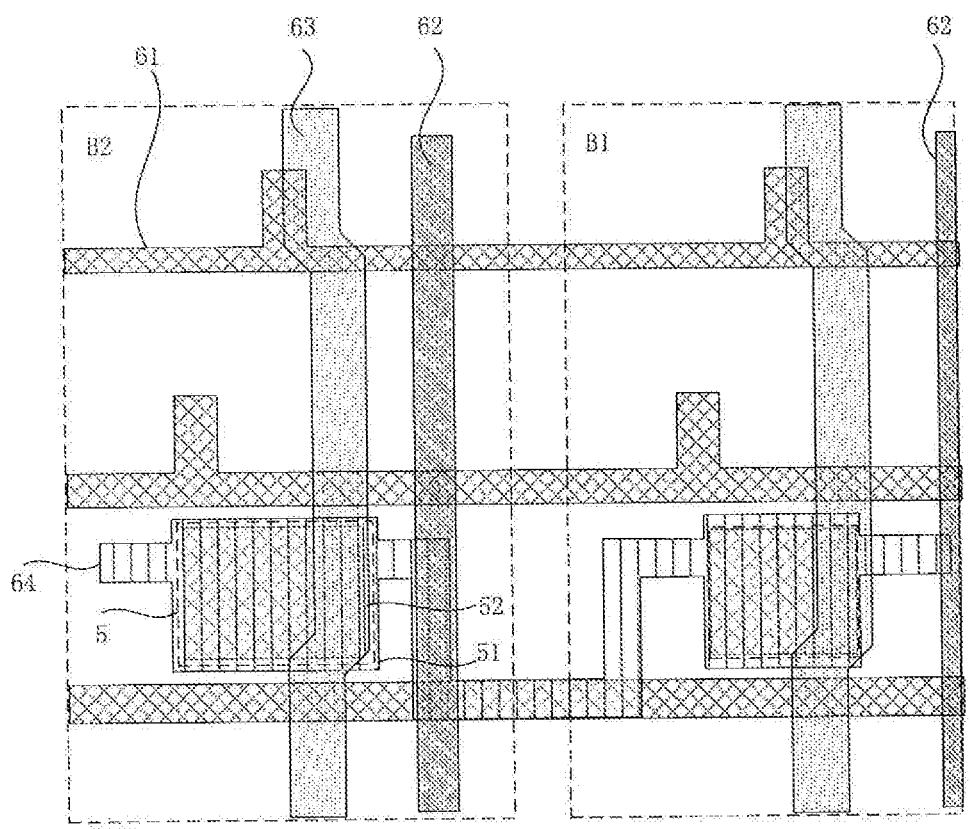
FIG. 11 is u top structural view of another display panel according to an embodiment of the present disclosure.

Optionally, the array substrate further includes a plurality of metal wires, at least one of the metal wires in the first region each has at least one part, and a line width of the at least one part is smaller than a line width of the metal wire in the second region. Exemplarily, the metal wires include one or more of: a power supply signal line, a data signal line, a scanning signal line and a light emitting control signal line. FIG. 11 is a top structural view of another display panel according to an embodiment of the present disclosure. In conjunction with FIGS. 2, 9 and 11, a power supply signal line 63 is electrically connected to a port PVDD, a data signal line 62 is electrically connected in a port Vdata of the corresponding pixel driving circuit 6, a scanning signal line 61 is electrically connected to a port Sn of the corresponding pixel driving circuit 6, and a port Sn−1 of the pixel driving circuit 6 is electrically connected to the scanning signal line 61 corresponding to the pixel driving circuit 6 in a previous row. The light emitting control signal line 64 is fabricated in the same layer as the capacitor 5 for achieving a connection relationship with the capacitor 5.

In conjunction with FIGS. 2, 9 and 11, exemplarily, the line width of the data signal line 62 in the first region B1, where the fingerprint identification unit 3 is provided, of the display panel is smaller than the line width of the data signal line 62 in the second region B2, where no fingerprint identification unit 3 is provided. Alternatively, the line width of a part of the data signal line 62 in the first region B1 may also be smaller than the line width of the data signal line 62 in the second region B2 when no fingerprint identification unit 3 is provided. The the metal wires are opaque, and a line width of at least a pan of at least one metal wire in the first region B1 is smaller than a line width of the metal wire in the second region B2, which reduces the area of the non-light transmittance region of the first region B1 relative to the related art, benefits for increasing the light transmittance of the first region B1 provided with the fingerprint identification unit 3 in per unit area, and increases the magnitude of the fingerprint identification signal of the display panel.

Optionally, one metal wire may include a part disposed in the first region B1 and a part disposed in the second region B2, the line width of at least one sub part of the part of the metal wire disposed in the first region B1 may be smaller than the line width of the part of the metal wire disposed in the second region B2 not provided with the fingerprint identification unit 3. For example, the line widths of all sub parts of the part of the metal wire disposed in the first region B1 may all be smaller than the line width of the part of the metal wire disposed in the second region B2 not provided with the fingerprint identification unit 3. Alternatively, the fine widths of some sub parts of the part of the metal wire disposed in the first region B1 may be smaller than the line width of the part of the metal wire disposed in the second region B2 not provided with the fingerprint identification unit 3, and the line widths of other sub parts of the part of the metal wire disposed in the first region B1 are equal to the line width of the part of the metal wire disposed in the second region B2 not provided with the fingerprint identification unit 3. With such configuration, the influence of the line width variation of the metal wire on the display effect of the display panel is minimized while improving the light transmittance of the display panel and the detection accuracy of the fingerprint identification.

Optionally, in conjunction with FIGS. 2 and 3, the pixel unit 2 includes a reflecting electrode and at least one of the reflecting electrodes in the first region b1 has a smaller area than the reflecting electrode in the second region B2. Taking the organic light emitting display panel as an example, the pixel unit 2 may include an anode 21, a cathode 22 and a light emitting layer 23 disposed between the anode 21 and the cathode 22. The cathode 22 is disposed on a side, facing away from the array substrate 1, of the anode 21. The display panel may be in a top-emitting type, and the anode 21 of the pixel unit 2 is the reflecting electrode. The reflecting electrode is opaque. In FIG. 3, exemplarily, a reflecting electrode 211 in the first region B1 has a smaller area than a reflecting electrode 212 in the second region B2. By arranging at least one of the reflecting electrodes in the first region B1 to have a smaller area than the reflecting electrode in the second region, the area of the non-light transmittance region of the first region B1 of the display panel where the fingerprint identification unit is provided is reduced, which benefits for increasing the light transmittance of the first region B1 provided with the fingerprint identification unit 3 in per unit urea, and increases the magnitude of the fingerprint identification signal of the display panel.

Optionally, as shown in FIG. 3, the pixel unit 2 may serve as a light source for a fingerprint identification module 2, the light emitted by the pixel unit 2 is reflected by the touch body 4 to the fingerprint identification unit 3, and the fingerprint identification unit 3 performs the fingerprint identification according to the received reflected light. The display panel may be an organic light emitting display panel. The pixel unit 2 may be an organic light emitting structure 24 the fingerprint identification unit 3 may perform fingerprint identification according to light emitted by the organic light emitting structure, and reflected by the touch body 4 to the fingerprint identification unit, such as the light denoted by a solid line in FIG. 3. It is to be noted that FIG. 3 exemplarily illustrates the relative positions of the organic light emitting structure 24 and the fingerprint identification unit 3, which are not limited in the embodiments of the present disclosure, as long as the light emitted by the organic tight emitting structure 24 can be reflected by the touch body 4 to the fingerprint identification unit 3.

Optionally, as shown in FIG. 3, the fingerprint identification module 2 may further include a fingerprint identification light source 81 and a second substrate 82. The second substrate 82 is disposed on a side, facing away from the array substrate 1, of the fingerprint identification unit 3, and the fingerprint identification tight source 81 is disposed on a side, facing away from the fingerprint identification unit 3, of the second substrate 82. The light emitted by the fingerprint identification light source 81 is incident on the touch body 4 via a gap between two adjacent fingerprint identification unit 3. The light emitted by the fingerprint identification light source 81 is reflected by the touch body 4, and the reflected light is received by the fingerprint identification unit 3. The fingerprint identification unit 3 performs the fingerprint identification according to the received reflected light, such as the light denoted by a dashed line in FIG. 3. Optionally, the light emitted by the fingerprint identification light source 81 is incident on the touch body 4 via a gap between two adjacent fingerprint identification units 3.

It is to be noted that the position of the fingerprint identification light source 81 is not limited in the embodiments of the present disclosure, as long as the light emitted by the fingerprint identification light source 81 can be reflected by the touch body 4 to the fingerprint identification unit 3. In addition, the solid line and the dashed line shown in FIG. 3 merely exemplarily illustrate a certain light emitted from the organic light emitting structure 24 and a certain light emitted from the fingerprint identification light source 81, and the lights emitted by the organic light emitting structure 24 diverge and the lights emitted by the fingerprint recognition light source 81 diverge.

Exemplarily, the fingerprint identification light source 81 may be a collimation light source or a surface light source. Compared with the use of the surface light source, the use of the collimation light source may reduce crosstalk between different fingerprint identification units 3 caused by the lights reflected by fingerprint of the user's finger, thus improving the precision of fingerprint identification. However, since the collimation light source is often thicker than the surface light source, the use of the collimation light source increases the thickness of the display panel.

Optionally, as shown in FIG. 3, the display panel may further include an encapsulation layer 83, a polarizer 84 and a cover glass 85, which are sequentially disposed on the pixel unit 2. The encapsulation layer 83 may include an encapsulation glass or a thin film encapsulation layer. When the encapsulation layer 83 includes the encapsulation glass, the display panel is not bendable. When the encapsulation layer 83 includes the thin film encapsulation layer, the display panel is bendable. Optionally, the second substrate 82 serving as a substrate of the fingerprint identification unit 3 may include a glass substrate or a flexible substrate. Exemplarily, the cover glass 85 may be bonded to the polarizer 84 by optical adhesive.

It is to be noted that, the solution of reducing the capacitance relative to the related art, the solution of reducing the line width relative to the related art, and the solution of reducing the area of the reflecting electrode relative to the related art may be used independently or used together, which is not limited in the embodiments of the present disclosure. In addition, the drawings of the embodiments of the present disclosure just exemplarily illustrate the sizes of each element and the thickness of each film layer, and do not represent the actual sizes of each element and each film layer in the display panel.

Figure 12:
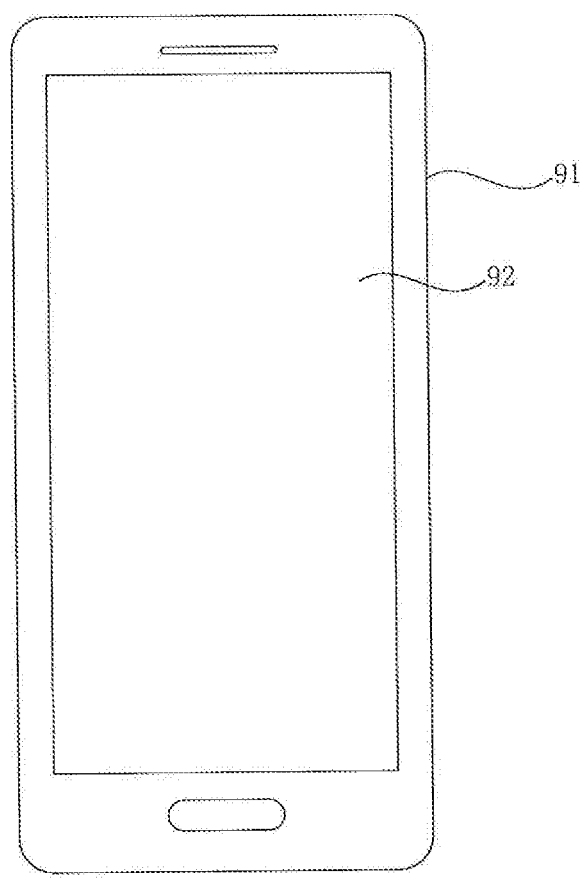
FIG. 12 is a structural view of a display apparatus according to an embodiment of the present disclosure.

An embodiment of the present disclosure further provides a display apparatus. FIG. 12 is a structural view of the display apparatus according to the embodiment of the present disclosure. As shown in FIG. 12, the display apparatus 91 includes a display panel 92 of the above embodiments. Therefore, the display apparatus 91 provided by the embodiment of the present disclosure also has the beneficial effects described in the above embodiments, which are not described here again.

It is to be noted that the above are only exemplary embodiments of the present disclosure and the technical principles used therein. It will be understood by those skilled in the art that the present disclosure is not limited to the specific embodiments described herein. Those skilled in the art can make various modifications, adaptations and substitutions without departing from the scope of the present disclosure. Therefore, while the present disclosure has been described in detail via the above-mentioned embodiments, the present disclosure is not limited to the above-mentioned embodiments and may include more other equivalent embodiments without departing from the concept of the present disclosure. The scope of the present disclosure is determined by the scope of the appended claims.

What is claimed is:

1. A display panel, comprising:
an array substrate and a plurality of pixel units disposed on the array substrate;
at least one fingerprint identification unit disposed on a side, facing away from the plurality of pixel units, of the array substrate and configured to perform fingerprint identification according to light reflected by a touch body to the fingerprint identification unit; and
a display region and a non-display region surrounding the display region, wherein the display region comprises a first region and a second region, and the at least one fingerprint identification unit is disposed in the first region,
wherein on a side, facing towards a light emitting surface of the display panel, of the fingerprint identification unit, an area of a non-light transmittance region in per unit area of the first region is smaller than an area of a non-light transmittance region in per unit area of the second region, and both the area of the non-light transmittance region in per unit area of the first region and the area of the non-light transmittance region in per unit area of the second region per unit area are calculated with respect to a plane parallel to a plane where the display panel is located;

wherein the array substrate comprises a plurality of electrode pairs, and each electrode pair includes a first electrode and a second electrode, which are opposite to each other and form a capacitor; and wherein at least one of first electrodes in the first region each has an area smaller than an area of a first electrode in the second region, and/or wherein at least one of second electrodes in the first region each has an area smaller than an area of a second electrode in the second region.

2. The display panel of claim 1, wherein an area of an orthographic projection of the capacitor in the first region on the plane where the display panel is located is smaller than an area of an orthographic projection of the capacitor in the second region on the plane where the display panel is located.

3. The display panel of claim 1, wherein the first electrode of the each electrode pair is disposed on a side, facing away from the fingerprint identification unit, of the second electrode of the each electrode pair, and the at least one of the first electrodes in the first region each has an area smaller than an area of the first electrode in the second region.

4. The display panel of claim 1, wherein the array substrate comprises a first substrate and a gate layer and a source-drain layer, the gate layer and the source-drain layer are sequentially disposed in a direction away from the first substrate, and wherein each of the plurality of pixel units comprises an anode, a light emitting layer and a cathode which are sequentially disposed in a direction away from the array substrate, and wherein second electrodes in the first and second regions are disposed in the gate layer.

5. The display panel of claim 1, wherein in the first region, at least one of the first electrodes has an area equal to the area of the first electrode in the second region and is disposed between any two first electrodes of the first region the area of each of which is smaller than the area of the first electrode in the second region.

6. The display panel of claim 1, further comprising:
a plurality of pixel driving circuits,
wherein when a driving transistor in a pixel driving circuit of the plurality of pixel driving circuits is a P-type transistor and a luminance of a first pixel unit is equal to that of a second pixel unit, a first gray scale voltage inputted to the first pixel unit is greater than a second gray scale voltage inputted to the second pixel unit;
wherein when the driving transistor in the pixel driving circuit is an N-type transistor, the first gray scale voltage inputted to the first pixel unit is smaller than the second gray scale voltage inputted to the second pixel unit; and
the first pixel unit is a pixel unit corresponding to a first electrode in the first region having an area smaller than the area of the first electrode in the second region, and the second pixel unit is a pixel unit corresponding to the first electrode in the second region.

7. The display panel of claim 1, wherein the plurality of pixel units are configured to emit lights of at least two colors,
wherein first electrodes in the first region the area of each of which is smaller than the area of the first electrode in the second region are respectively disposed in pixel units which emit lights of the same color; or wherein first electrodes in the first region the area of each of which is smaller than the area of the first electrode in the second region are respectively disposed in pixel units which emit lights of the two colors, and a quantity of first electrodes in the first region, each of which has a smaller area than the first electrode in the second region and corresponds to a pixel unit emitting light of one of the at least two colors, is equal to a quantity of first electrodes in the first region, each of which has a smaller area than the first electrode in the second region and corresponds to a pixel unit emitting light of another one of the at least two colors.

8. The display panel of claim 1, wherein the array substrate comprises a plurality of metal wires, and at least one of the metal wires in the first region each has at least one part, a line width of the at least one part is smaller than a line width of the metal wire in the second region.

9. The display panel of claim 8, wherein the metal wires comprise one or more of: a power supply signal line, a data signal line, a scanning signal line and a light emitting control signal line.

10. The display panel of claim 1, wherein each of the plurality of pixel units comprises a reflecting electrode, and at least one of reflecting electrodes in the first region each has a smaller area than that of a reflecting electrode in the second region.

11. The display panel of claim 10, wherein each of the plurality of pixel units comprises an anode, a cathode and a light emitting layer disposed between the anode and the cathode, the cathode is disposed on a side, facing away from the array substrate, of the anode, and the anode is the reflecting electrode.

12. The display panel of claim 1, wherein the plurality of pixel units serve as light sources for the fingerprint identification unit, and lights emitted by the plurality of pixel units are reflected by the touch body to the fingerprint identification unit.

13. The display panel of claim 1, further comprising: a fingerprint identification light source and a second substrate,
wherein the second substrate is disposed on a side, facing away from the array substrate, of the fingerprint identification unit, and the fingerprint identification light source is disposed on a side, facing away from the fingerprint identification unit, of the second substrate,
wherein a quantity of the at least one fingerprint identification unit is greater than or equal to 2, light emitted by the fingerprint identification light source is irradiated to the touch body via a gap between two adjacent fingerprint identification units, and is reflected by the touch body to the fingerprint identification unit.

14. The display panel of claim 1, wherein each of the plurality of pixel units comprises a driving transistor and a capacitor, and the plurality of pixel units comprise: first pixel units in the first region, second pixel units in the second region, and third pixel units in the first region, an area of the capacitor in the first pixel unit is less than an area of the capacitor in the second pixel unit, and an area of the capacitor in the third pixel unit is equal to the area of the capacitor in the second pixel unit.

15. The display panel according to claim 14, wherein any two of the first pixel units are spaced apart from each other by at least one of the third pixel units.

16. The display panel according to claim 14, wherein all of the first pixel units emit lights of a same color.

17. The display panel according to claim 14, wherein a quantity of first pixel units emit red color is equal to a quantity of first pixel units emit green color, and also equal to a quantity of first pixel units emit blue color.

18. A display apparatus, comprising a display panel, wherein the display panel comprises:

an array substrate and a plurality of pixel units disposed on the array substrate;

at least one fingerprint identification unit disposed on a side, facing away from the plurality of pixel units, of the array substrate and configured to perform fingerprint identification according to light reflected by a touch body to the fingerprint identification unit; and a display region and a non-display region surrounding the display region, wherein the display region comprises a first region and a second region, and the at least one fingerprint identification unit is disposed in the first region, wherein on a side, facing towards a light emitting surface of the display panel, of the fingerprint identification unit, an area of a non-light transmittance region in per unit area of the first region is smaller than an area of a non-light transmittance region in per unit area of the second region, and both the area of the non-light transmittance region in per unit area of the first region and the area of the non-light transmittance region in per unit area of the second region per unit area are calculated with respect to a plane parallel to a plane where the display panel is located;

wherein the array substrate comprises a plurality of electrode pairs, and each electrode pair includes a first electrode and a second electrode, which are opposite to each other and form a capacitor; and wherein at least one of first electrodes in the first region each has an area smaller than an area of a first electrode in the second region, and/or wherein at least one of second electrodes in the first region each has an area smaller than an area of a second electrode in the second region.

* * * * *